United States Patent [19]
Mori et al.

[11] Patent Number: 5,268,744
[45] Date of Patent: Dec. 7, 1993

[54] METHOD OF POSITIONING A WAFER WITH RESPECT TO A FOCAL PLANE OF AN OPTICAL SYSTEM

[75] Inventors: Tetsuya Mori, Yokohama; Akiyoshi Suzuki, Tokyo, both of Japan

[73] Assignee: Canon Kabushiki Kaisha, Tokyo, Japan

[21] Appl. No.: 680,547

[22] Filed: Apr. 4, 1991

[30] Foreign Application Priority Data

Apr. 6, 1990 [JP] Japan .................. 2-091698
Mar. 25, 1991 [JP] Japan .................. 3-084780

[51] Int. Cl.$^5$ .......................... G01B 11/00
[52] U.S. Cl. .................. 356/400; 250/201.4
[58] Field of Search .................. 356/399–401; 355/43, 53; 250/548, 201.1, 201.2, 201.4, 201.6, 204

[56] References Cited

U.S. PATENT DOCUMENTS

| 4,650,983 | 3/1987 | Suwa | 250/204 |
| 4,705,940 | 11/1987 | Kohno | 250/548 |
| 4,952,815 | 8/1990 | Nishi | 356/400 |

Primary Examiner—Richard A. Rosenberger
Assistant Examiner—K. F. Hantis
Attorney, Agent, or Firm—Fitzpatrick, Cella, Harper & Scinto

[57] ABSTRACT

A method of positioning a surface of a wafer with respect to a focal plane of an optical system is disclosed. The method includes: forming an image of a pattern in a first region of a wafer through the optical system; projecting through the optical system a radiation beam to the first region of the wafer and projecting through the optical system a reflection beam from the first region of the wafer onto a predetermined plane; evaluating the formed image to determine the focal plane of the optical system and determining, as a reference position, a position of incidence on the predetermined plane of the reflection beam from the first region of the wafer at a level corresponding to the determined focal plane; projecting a radiation beam to a second region of the wafer and projecting through the optical system a reflection beam from the second region of the wafer onto the predetermined plane; and positioning the second region of the wafer on the determined focal plane of the optical system on the basis of a position of incidence of the reflection beam from the second region of the wafer with respect to the determined reference position.

42 Claims, 5 Drawing Sheets

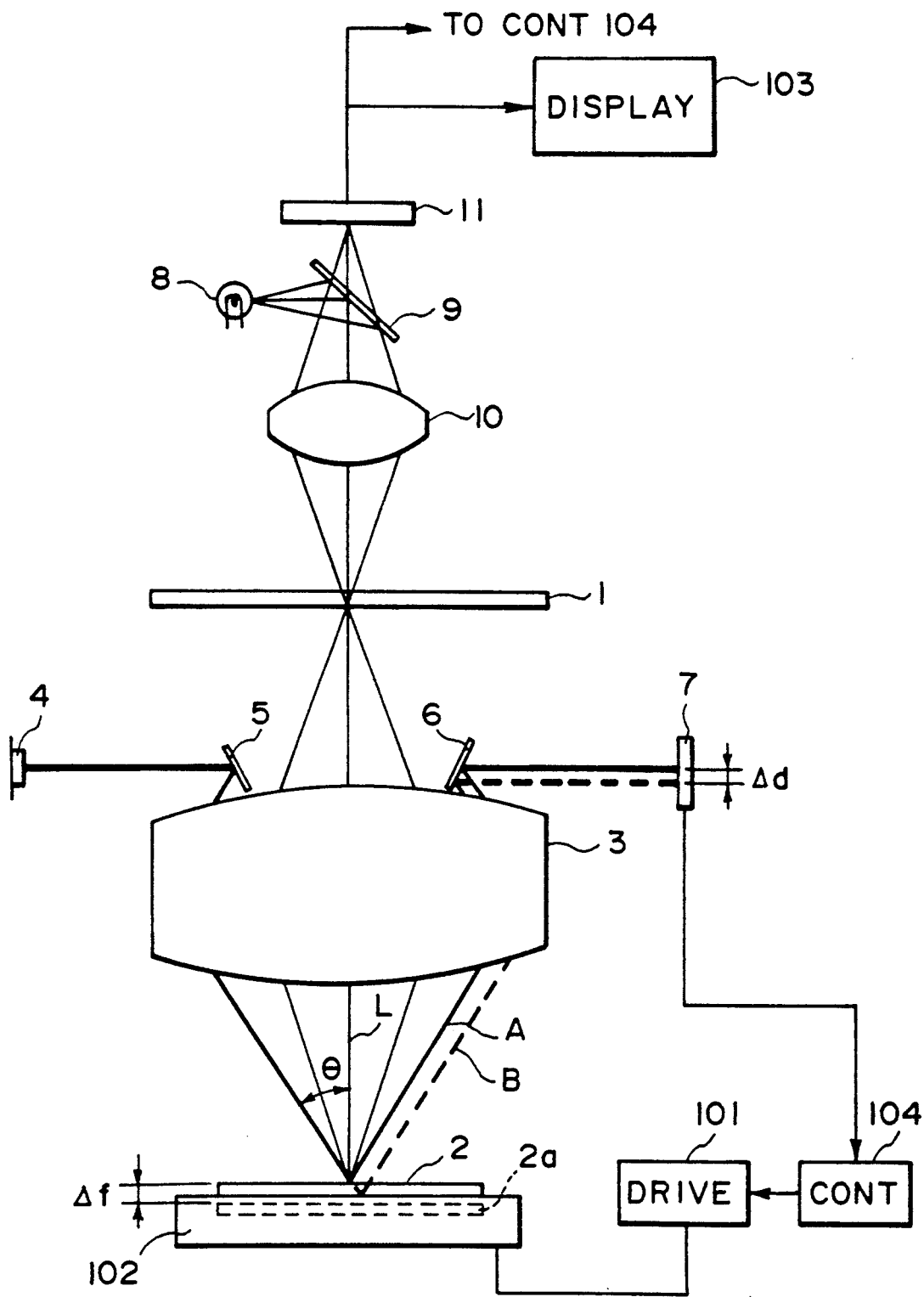
F I G. 1

METHOD OF POSITIONING A WAFER WITH RESPECT TO A FOCAL PLANE OF AN OPTICAL SYSTEM

FIELD OF THE INVENTION AND RELATED ART

This invention relates to a method of positioning a wafer with respect to a focal plane of an optical system. As an example, the method of the present invention is usable in a semiconductor device manufacturing projection exposure apparatus, as a focusing method for positioning different zones of a wafer in sequence with respect to a focal plane of a projection lens system or a focal plane of an alignment scope disposed beside the projection lens system, for detection of an image of an alignment mark provided in relation to each region.

In projection exposure apparatuses, a method is known wherein a TV camera is used to observe an image of an alignment mark of each zone of a wafer through a projection lens system and, on the basis of the position of the detected image of the mark, the position of that zone is adjusted. For the observation, the image of the alignment mark is projected onto a sensor and the contrast of the image is evaluated. Then, the wafer is displaced upwardly or downwardly so that an image of better contrast is obtained. In this manner, each zone of the wafer is positioned on the focal plane of the projection lens system. After this is attained, the image of the alignment mark is focused on the sensor, and the position of the image of the mark is detected.

With this method, however, for each zone of the wafer, the wafer has to be displaced upwardly or downwardly to detect a change in contrast of the image of the alignment mark. This requires a long time and, therefore, leads to a decreased production efficiency in semiconductor device manufacture.

SUMMARY OF THE INVENTION

It is accordingly a primary object of the present invention to provide an improved method of positioning a wafer with respect to a focal plane of an optical system such as a projection optical system, for example.

In accordance with a first aspect of the present invention, to achieve this object, there is provided a method of positioning a surface of a wafer with respect to a focal plane of an optical system, comprising the steps of: forming an image of a pattern in a first region of a wafer through the optical system; projecting through the optical system a radiation beam to the first region of the wafer and projecting through the optical system a reflection beam from the first region of the wafer onto a predetermined plane; evaluating the formed image to determine the focal plane of the optical system and determining, as a reference position, a position of incidence on the predetermined plane of the reflection beam from the first region of the wafer at a level corresponding to the determined focal plane; projecting a radiation beam to a second region of the wafer and projecting through the optical system a reflection beam from the second region of the wafer onto the predetermined plane; and positioning the second region of the wafer on the determined focal plane of the optical system on the basis of a position of incidence of the reflection beam from the second region of the wafer with respect to the determined reference position.

In accordance with a second aspect of the present invention, there is provided a method of manufacturing semiconductor devices, comprising the steps of: forming an image of a pattern of a wafer through the optical system; projecting through the optical system a radiation beam to the wafer and projecting through the optical system a reflection beam from the wafer to a predetermined plane; evaluating the formed image to determine the focal plane of the optical system and determining, as a reference position, a position of incidence on the predetermined plane of the reflection beam from the the wafer at a level corresponding to the determined focal plane; projecting a radiation beam to different regions of the wafer sequentially and projecting through the optical system a reflection beam from each region of the wafer onto the predetermined plane; positioning each region of the wafer on the determined focal plane of the optical system on the basis of a position of incidence of the reflection beam from that region of the wafer with respect to the determined reference position; detecting through the optical system an alignment mark provided in each region of the wafer as positioned on the focal plane to adjust the position of that region with respect to a circuit pattern to be transferred to that region, on the basis of the detection; and printing the circuit pattern on each region of the wafer.

In accordance with a third aspect of the present invention, there is provided a method of manufacturing semiconductor devices, comprising the steps of: projecting through an optical system a radiation beam to a first region of the wafer and projecting through the optical system a reflection beam from the first region of the wafer onto a predetermined plane; determining, as a reference position, a position of incidence on the predetermined plane of the reflection beam from the first region of the wafer at a level corresponding to a focal plane of the optical system; projecting a radiation beam to a second region of the wafer and projecting, onto the predetermined plane, a reflection beam from the second region of the wafer corresponding to a level of the second region of the wafer; moving the second region of the wafer toward the focal plane on the basis of a position of incidence on the predetermined plane of the reflection beam from the second region of the wafer and the determined reference position; detecting through the optical system an alignment mark of the second region of the wafer as the same is at a level corresponding to the focal plane of the optical system; adjusting the position of the second region of the wafer with respect to a circuit pattern to be transferred to the second region, on the basis of the detected image of the alignment mark; and printing the circuit pattern on the second region of the wafer.

In accordance with a fourth aspect of the present invention, there is provided a method of manufacturing semiconductor devices, comprising the steps of: forming an image of a pattern in a first region of a wafer through an optical system having a focal plane; projecting through the optical system a radiation beam to the first region of the wafer and projecting through the optical system a reflection beam from the first region of the wafer onto a predetermined plane; evaluating the formed image to determine the focal plane of the optical system and determining, as a reference position, a position of incidence on the predetermined plane of the reflection beam from the first region of the wafer at a level corresponding to the determined focal plane; projecting a radiation beam to a second region of the wafer and projecting through the optical system a reflection beam from the second region of the wafer onto the predetermined plane; and positioning the second region of the wafer on the determined focal plane of the optical system on the basis of a position of incidence of the reflection beam from the second region of the wafer with respect to the determined reference position.

In accordance with a fifth aspect of the present invention, there is provided a projection exposure apparatus, comprising: a movable stage for holding a wafer; a projection optical system having a focal plane, for projecting an image of a circuit pattern of a reticle upon the focal plane; a first detection optical system having a first sensor, for detecting an image of a mark in a first region of the wafer through said projection optical system and said first sensor, wherein said first sensor is responsive to an intensity distribution of the image of the mark of the wafer; a second detection optical system having a second sensor, for projecting through said projection optical system a radiation beam to the wafer and for detecting a reflection beam from the wafer through said projection optical system and said second sensor, wherein said second sensor is responsive to a position of incidence of the received reflection beam; and a controller for receiving outputs of said first and second sensors to control the movement of said movable stage, said controller being operable to evaluate the image of the mark in the first region of the wafer on the basis of the output of said first sensor while moving said stage in a direction of an optical axis of said projection optical system to determine the focal plane of said projection optical system and being operable to memorize the output of said second sensor as the first region of the wafer is substantially at the determined focal plane of said projection optical system, and said controller being further operable to cause said second detection optical system to project a radiation beam to a second region of the wafer and operable to evaluate an output of said second sensor produced in response to reception of a reflection beam from the second region of the wafer with respect to the memorized output of said second sensor, to control said movable stage to position the second region of the wafer on the determined focal plane of the projection optical system.

In accordance with a sixth aspect of the present invention, there is provided a projection exposure apparatus, comprising: a movable stage for holding a wafer; a projection optical system having a focal plane, for projecting an image of a circuit pattern of a reticle upon the focal plane; a detection optical system including (i) an objective lens disposed beside said projection optical system, (ii) first detecting means with a first sensor, for detecting an image of a mark in a first region of the wafer through said objective lens and said first sensor, and (iii) second detecting means with a second sensor, for projecting a radiation beam to the wafer through said objective lens and for detecting a reflection beam from the wafer through said objective lens and said second sensor, wherein said first sensor is responsive to an intensity distribution of the image of the mark of the wafer and wherein said second sensor is responsive to a position of incidence of the received reflection beam; and a controller for receiving outputs of said first and second sensors to control the movement of said movable stage, said controller being operable to evaluate the image of the mark in the first region of the wafer on the basis of the output of said first sensor while moving said stage in a direction of an optical axis of said projection optical system to determine the focal plane of said projection optical system and being operable to memorize the output of said second sensor as the first region of wafer is substantially at the determined focal plane of said projection optical system, and said controller being further operable to cause said second detection optical system to project a radiation beam to a second region of the wafer and operable to evaluate an output of said second sensor produced in response to reception of a reflection beam from the second region of the wafer with respect to the memorized output of said second sensor, to control said movable stage to position the second region of the wafer on the determined focal plane of the projection optical system.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic view of a projection exposure apparatus to which a first embodiment of the present invention is applied.

DESCRIPTION OF THE PREFERRED EMBODIMENTS

Figure 2:
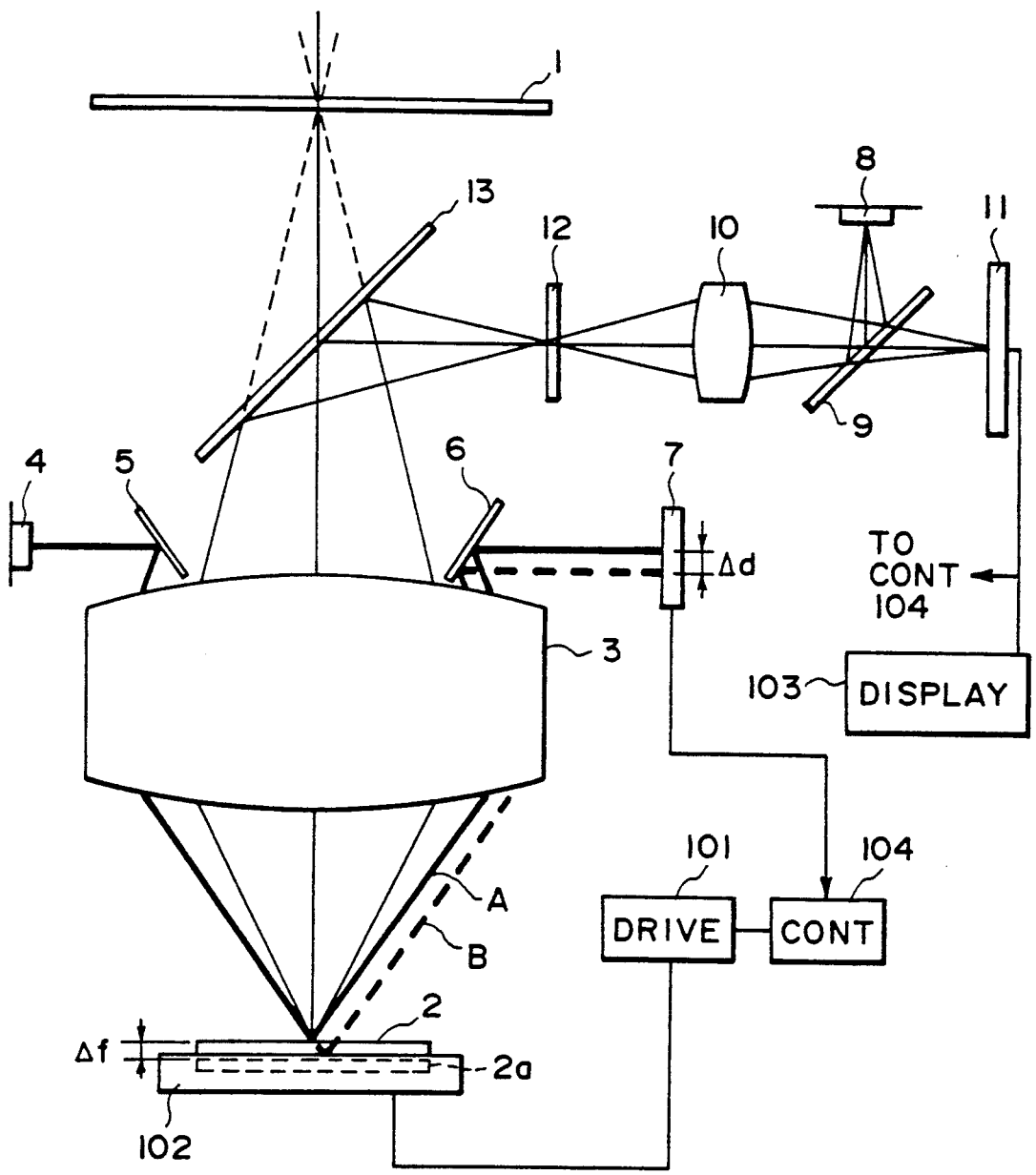
FIG. 2 is a schematic view of a projection exposure apparatus to which a second embodiment of the present invention is applied.

FIG. 1 is a schematic view showing a major part of a projection exposure apparatus for manufacture of semiconductor devices, to which a first embodiment of the present invention is applied. This projection exposure apparatus is arranged to execute the photoprinting with light of i-line having a wavelength of 365 nm.

Denoted in FIG. 1 at 1 is a reticle (first object) having formed on its bottom surface an electronic circuit pattern to be projected onto a resist of a semiconductor wafer (second object), to be described later. This circuit pattern is placed on one focal plane (object plane) of a reduction projection lens system (imaging lens system) 3.

The wafer (second object) 2 is placed on a wafer stage 2, at a position adjacent to another focal plane (image plane) of the lens system 3. Thus, an image of the circuit pattern of the reticle 1 can be projected through the lens systems 3 onto the resist of the wafer 2, at a predetermined magnification. For manufacture of semiconductor chips, a circuit pattern is transferred to each of different zones of the wafer 2 surface.

An alignment mark of a predetermined pattern is formed on the wafer 2 for detection of the wafer position, for reticle-to-wafer alignment. Such a mark is used in this embodiment also for focusing each zone of the wafer 2 with respect to the image plane of the lens system 3. Denoted at 8 is a first light source. Light from the first light source 8 is received by a filter (not shown), whereby an i-line component thereof is extracted. The extracted i-line light is reflected by a half mirror 9 and is incident on an observation lens 10. The light passing through the observation lens 10 is directed to illuminate the reticle 1 and, after passing through the lens system 3, it illuminates the alignment mark of the wafer 2.

With the light reflected by the wafer 2, the alignment mark of the wafer 2 is imaged by the lens system 3 on the reticle 1 surface and, after passing through the observation lens 10 and the half mirror 9, it is re-imaged on a light receiving surface of an image pickup device 11 which comprises a CCD, for example. The image pickup device 11 serves to photoelectrically convert the received image of the alignment mark and produces a corresponding video signal.

In this embodiment, the optical components 9, 10 and 11 are so set that the bottom surface of the reticle 1 and the light receiving surface of the image pickup device 11 are placed in an optically conjugate relationship. The image of the alignment mark as formed on the light receiving surface of the image pickup device 11 can be observed as the video signal from the image pickup device is inputted to a display 103. Also, the video signal from the image pickup device 11 is applied to a controller 104.

The components denoted 3, 8, 9, 10 and 11 cooperate to provide a first detecting means for detecting height (position) of the wafer 2 surface in accordance with the contrast method.

In the first detecting means, the imaging state such as contrast, for example, of the image of the alignment mark of the wafer 2 as formed on the light receiving surface of the image pickup device 11 can be observed through the display 103, while moving the stage 102 upwardly or downwardly with a driving means 101 to displace the wafer 2 along an optical axis L direction of the lens system 3. Based on the observation, the wafer 2 surface can be positioned in the image plane of the lens system 3. To this end, the position of the wafer 2 at which an image of the alignment mark of best contrast is obtainable, is detected and the controller 104 controls movement of the stage 102 through the driving means 101 so as to locate the wafer 2 at the detected position.

In the above-described method, the image of the alignment mark displayed through the display 103 is observed by an operator, and an appropriate instruction is inputted to the controller 104 by the operator. Thus, the process is semi-automatic. However, the process may be executed fully automatically. That is, since a video signal from the image pickup device 11 is applied also to the controller 104, by evaluating the video signal through the controller 104, it is possible to detect the degree of contrast of the image of the alignment mark automatically. Thus, such a position of the wafer 2 with which the contrast of the image of the alignment mark becomes highest, can be determined and the wafer 2 can be placed at such a position automatically. This is also true with the case of embodiments to be described later. The first detecting means also can be used as a TTL (through the lens) alignment scope for detecting the position of the alignment mark of the wafer 2.

Next, a second detecting means for detecting level (position) of the wafer 2 surface in accordance with the grazing incidence method, will be explained.

Denoted at 4 is a second light source which is disposed in a space between the lens system 3 and the reticle 1. Light from the second light source 4 is reflected by a mirror 5 and is incident on the lens system 3. Here, the optical components 4 and 5 are so set that the light emanating from the second light source 4 and passing through the lens system 3 is incident on the wafer 2 surface at an angle θ (e.g. θ = 10-30 deg.) with respect to the optical axis L of the lens system 3.

Reflection light produced as a result of reflection of the light from the second light source 4 by the wafer 2 surface goes through the lens system 3 and, after being reflected by a mirror 6, it is incident on the surface of a light receiving means 7. Here, if the wafer 2 surface is at the image plane of the lens system 3, the reflection light from the wafer 2 goes along a path A (solid line) and is incident at a certain position (reference position) on the light receiving means 7.

As compared therewith, if the wafer 2 is at a position 2a as depicted by a broken line, the wafer 2 surface is below the image plane and, therefore, the reflection light from the wafer 2 goes along a path B as depicted by a broken line. Thus, it is incident on the light receiving means 7, at a position deviated from the reference position.

In this embodiment, the light receiving means 7 comprises a sensor such as a PSD or CCD, which is responsive to the position of incidence of received light. Thus, the position of incidence of the reflection light from the wafer 2 upon the light receiving means 7 surface can be detected on the basis of the output from the light receiving means and, therefore, any positional deviation of the wafer 2 surface from the image plane of the lens system 3 can be detected.

The output signal from the light receiving means 7 is applied to the controller 104, and in response to the received output signal the controller 104 controls the driving means 101 to cause the same to move the wafer stage 102, carrying thereon the wafer 2, along the optical axis L to bring the wafer 2 surface into coincidence with the image plane position.

The components as denoted at 3, 4, 5, 6 and 7 cooperate to provide the second detecting means which is based on the grazing light incidence method.

In this embodiment, different zones of the wafer 2 are focused in sequence at the image plane of the lens system 3, whereby the surface of each zone can be brought into substantial coincidence with the image plane. This assures accurate projection of a sharp image of the circuit pattern of the reticle 1 upon each zone. Further, it ensures detection of a sharp image of an alignment mark of each zone through the detecting means (3, 8, 9, 10 and 11), for the wafer alignment purpose.

In the present embodiment, first, the first detecting means is used and, while moving the wafer 2 in the optical axis L direction, such a position of the wafer 2 with which the contrast of the image of the alignment mark of the wafer 2 as observed through the display 103 becomes maximum, is determined. Then, on the basis of the detection, the wafer 2 surface is positioned at the image plane of the lens system 3. At this time, by the second detecting means, the light from the second light source 4 is directed to the mirror 5, the lens system 3, the wafer 2 (whose surface is now coincident with the image plane), the imaging lens 3, the mirror 6 and the light receiving means 7, in this order.

At this time, the position of incidence on the light receiving means 7 surface of the reflection light from the wafer 2 provides a reference position for the detection through the second detecting means, and the output of the light receiving means 7 is memorized into a memory of the controller 104. The memorized data may be used for determination of a reference position for the detection through the second detecting means, in the succeeding focusing operation of each zone of the wafer 2 or the focusing operation of each zone of another wafer, processed in the same manner as the wafer 2. In this manner, the set-up of the second detecting means is accomplished by using the first detecting means. Thus, in the focusing operation for each zone of the same wafer (second object) 2 or in the focusing operation for each zone of a wafer (second object), processed in the same manner as the wafer 2 and having the same substrate structure as the wafer 2, with respect to the image plane of the lens system 3, the second detecting means based on the light grazing incidence (oblique incidence) method may be used.

If the surface of a zone of the wafer is not at the image plane, the reflection light from the second object goes along a path such as depicted by a broken line B, for example, and on the light receiving means 7 it is incident on a position spaced by a distance $\Delta d$ from the reference position. The distance $\Delta d$ corresponds to the positional deviation $\Delta f$ of the second object 2 surface from the image plane, wherein $\Delta d = 2 \cdot \beta \cdot \tan\theta \cdot \Delta f$ where $\beta$ is the imaging magnification of the second detecting system. Therefore, the quantity $\Delta f$ and direction of the positional deviation of the second object 2 surface from the image plane can be detected promptly and, thus, it is possible to place the second object 2 surface at the image plane position quickly. The accurateness of the position setting can be checked by examining the output of the light receiving means 7 with respect to whether the reflection light from the second object 2 is exactly incident at the reference position on the light receiving means 7.

As compared with a method wherein light is inputted from the side of the lens system 3, not through the lens system 3, the second detecting means of this embodiment is based on the TTL method using the lens system 3. Therefore, the detection can meet any change in position of the image plane due to a change in environmental condition of the lens system 3 such as temperature, pressure and the like. Further, there are additional advantages such as that no limitation is present with respect to the back focus of the lens system 3, that the system as a whole can be made compact and the like. If a wafer (second object) 2 of a different structure (substrate structure or resist structure) is to be used, the first detecting means is used to detect the image plane of the lens system 3 and the surface of such a wafer 2 is focused with respect to the image plane, and the reference position of the first detecting means is determined again. By this, it is possible to effectively prevent a detection error of the second detecting means, resulting from a change in structure of the substrate or resist of the wafer.

In a stepper which is a semiconductor device manufacturing printing apparatus, circuit patterns are printed on several tens or more shot areas (zones) of one wafer. If the focusing operation is made in accordance with the conventional contrast method with respect to each of these shot areas, a long time is necessary and the throughput of the apparatus decreases considerably. To avoid such inconvenience, for one wafer, the detection of the focus position is executed only with regard to a first shot area by using the first detecting means to determine the reference position on the sensor of the second detecting means. With regard to all the remaining shot areas, the focusing operation is made by using the second detecting means. This assures high-speed and high-precision focusing of each shot area (zone) of the wafer. As regards a wafer of the same process as the wafer 2, it may be considered that the reference position on the sensor of the second detecting means is unchanged. Therefore, the first detecting means may not be used again. Since the grazing incidence method is based on the TTL method, it is possible to meet a change in the image plane position of the lens system 3 resulting from a change in the environmental condition. Namely, for plural wafers of the same process, the focusing operation using the first detecting means is necessary only for a first shot area of a first wafer and, if this is done, correct focusing by the second detecting means is assured with regard to all the remaining shot areas or all the remaining wafers. Therefore, the throughput of the apparatus can be improved significantly.

Only for a wafer of a different process having a different resist film thickness or a different substrate, the reference position determination (calibration) of the sensor of the second detecting means, using the first detecting means, is necessary and, if it is done, the focusing operation for a wafer of that process is attainable only with the second detecting means. When the reference position in the detection by the second detecting means is memorized into a memory of the controller 104, in relation to each process, if a wafer of such a process is to be used again, the memorized reference position may be read out from the memory, avoiding the necessity of using the first detecting means.

In the foregoing description, the second detecting means is used to focus each zone of a wafer 2 on the image plane of the lens system 3 and, after this, an image of a circuit pattern of a reticle 1 is projected and printed on each zone. However, in addition to the pattern projection and printing, the present invention is usable in the alignment operation for the reticle and the wafer. More specifically, if a zone of the wafer 2 is brought into coincidence with the image plane of the lens system 3 by using the second detecting means, then that zone is in an optically conjugate relation with the light receiving surface of the image pickup device 11 of the first detecting means. Thus, an image of an alignment mark formed in relation to that zone can be sharply focused on the light receiving surface of the image pickup device 11. Thus, in accordance with an aspect of the present invention, the first detecting means can detect a sharp image of an alignment mark of a zone and, by evaluating the position of the image (to this end, the video signal from the image pickup device 11 is used), the position of the zone can be detected. On the basis of the detected position, the wafer 2 (each zone thereof) can be aligned with the reticle 1. Since a sharp image of a mark is detectable, the alignment precision can be enhanced significantly. For such an alignment operation, the controller 104 processes the video signal from the image pickup device 11 to evaluate the position of the image of the mark to determine the position of the zone of the wafer. Then, the controller 104 controls the driving means 101 to control the movement of the stage 102.

For the alignment method, any one of well-known alignment methods such as a die-by-die alignment method, a global alignment method and the like may be used.

The applicability of the invention to the alignment process is also true with the case of the second to fourth embodiments of the present invention, to be described later. Particularly, in a fifth embodiment, the invention is actually applied to the alignment process.

It is to be noted here that, in the preceding embodiment, an alignment mark is used as a mark of a wafer with respect to which the contrast of an image formed by the lens system 3 is evaluated by the first detecting means. However, in place of using such an alignment mark, a focusing pattern for the contrast evaluation may be formed on a wafer.

Also, the wavelength of light to be used in the present invention for the focusing operation is not limited to the design wavelength of the lens system 3. Any wavelength may be used provided that it is usable in the TTL method. As a further alternative, different wavelengths of lights may be used with the first and second detecting means, respectively, in combination with appropriate color filters for prevention of mixture of lights.

FIGS. 2, 3, 4 and 5 are schematic views showing second, third, fourth and fifth embodiments of the present invention, respectively. In these Figures, like numerals as those in FIG. 1 are assigned to corresponding elements.

In the second embodiment shown in FIG. 2, the components of the first detecting means are disposed in a space between the reticle 1 and the lens system 3. In this embodiment, reflection light from the wafer 2 passes through the lens system 3 and is reflected by the mirror 13, whereby it is projected on a reference plate 12 which is disposed at a position optically equivalent to the reticle 1. By this, an alignment mark of the wafer 2 is imaged on the reference plate 12 surface. The image of the wafer alignment mark as formed on the reference plate 12 surface is re-imaged by the observation lens 10 upon the image pickup device 11. In this embodiment, the positional relationship between the imaging plane of the reticle (first object) 1 and the surface of the wafer (second object) 2, namely, the state of focus of the wafer 2 surface with respect to the imaging plane, is detected indirectly through the reference plate 12. The remaining portion of the structure and function of this embodiment is essentially the same as the first embodiment.

Figure 3:
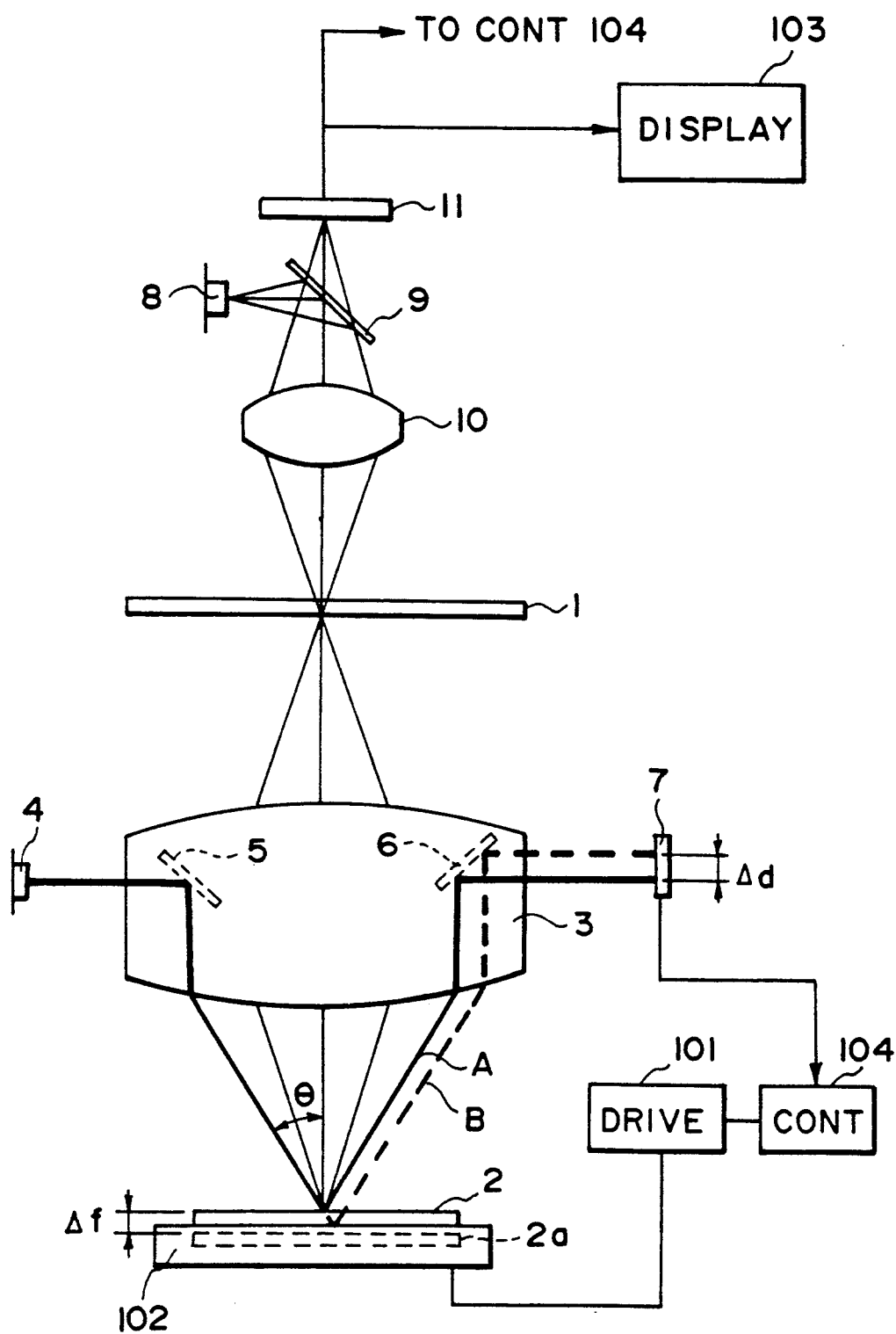
FIG. 3 is a schematic view of a projection exposure apparatus to which a third embodiment of the present invention is applied.

In the third embodiment shown in FIG. 3, as compared with the first embodiment of FIG. 1, in the second detecting means the light from the second light source 4 is reflected by a reflection mirror 5, which is provided in a portion of the lens system 3 (for example, at a pupil position thereof), and the reflected light is incident on the wafer 2. The reflection light from the wafer 2 is reflected by another reflection mirror 6 disposed at a similar position (for example, the pupil position), such that the light is directed to the light receiving means 7. The remaining portion of the structure and function is essentially the same as the first embodiment.

Figure 4:
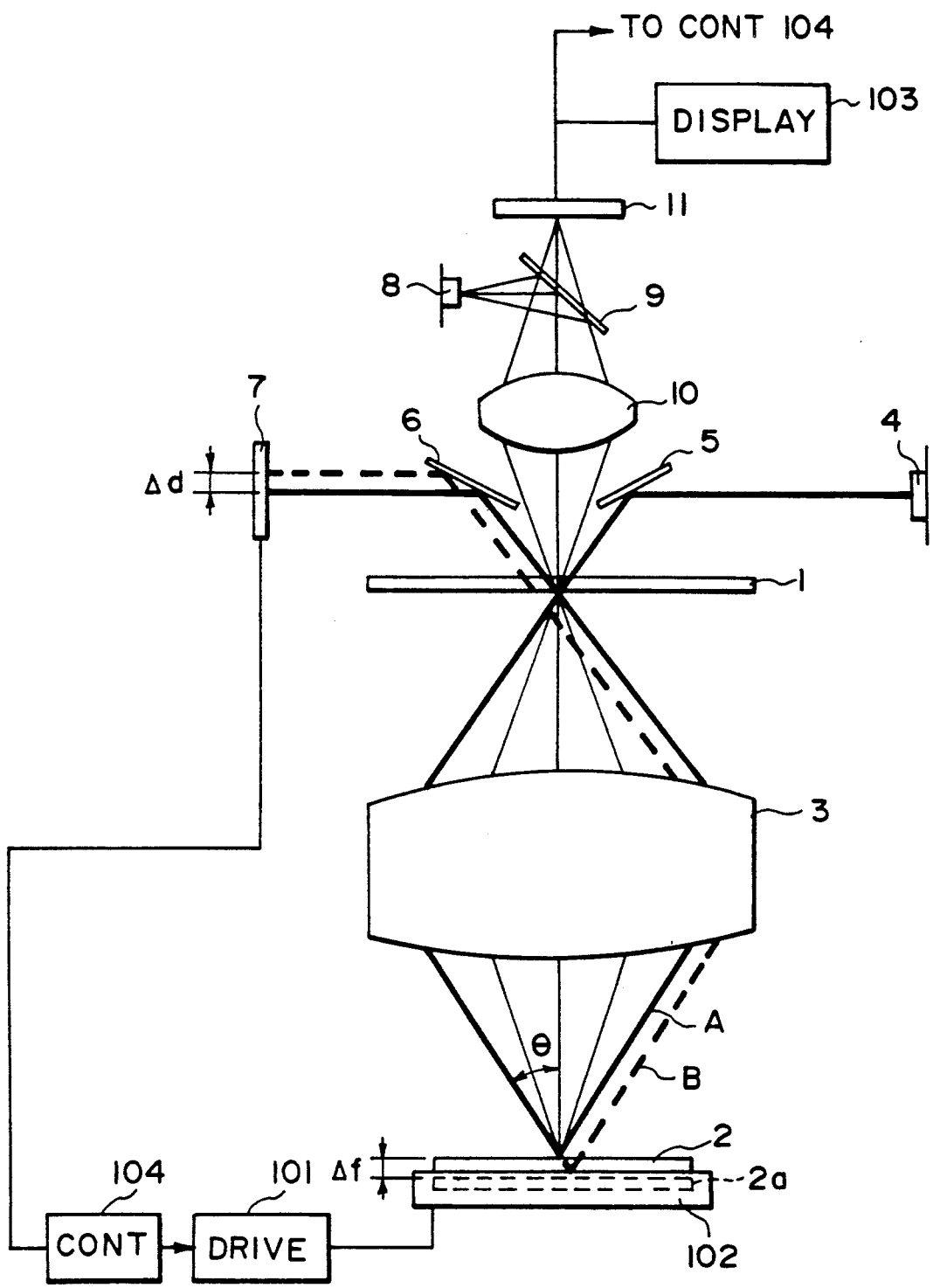
FIG. 4 is a schematic view of a projection exposure apparatus to which a fourth embodiment of the present invention is applied.

In the fourth embodiment shown in FIG. 4, the components 4, 5, 6 and 7 of the second detecting means are disposed in a space above the reticle 1. The light from the second light source 4 is reflected by a mirror 5 and, after passing through the reticle 1, it is directed through the lens system 3 to the wafer 2 surface. Reflection light from the wafer 2 passes through the lens system 3 and the reticle 1, and it is reflected by a mirror 6 toward the light receiving means 7. The remaining portion of the structure and function is essentially the same as the first embodiment.

Figure 5:
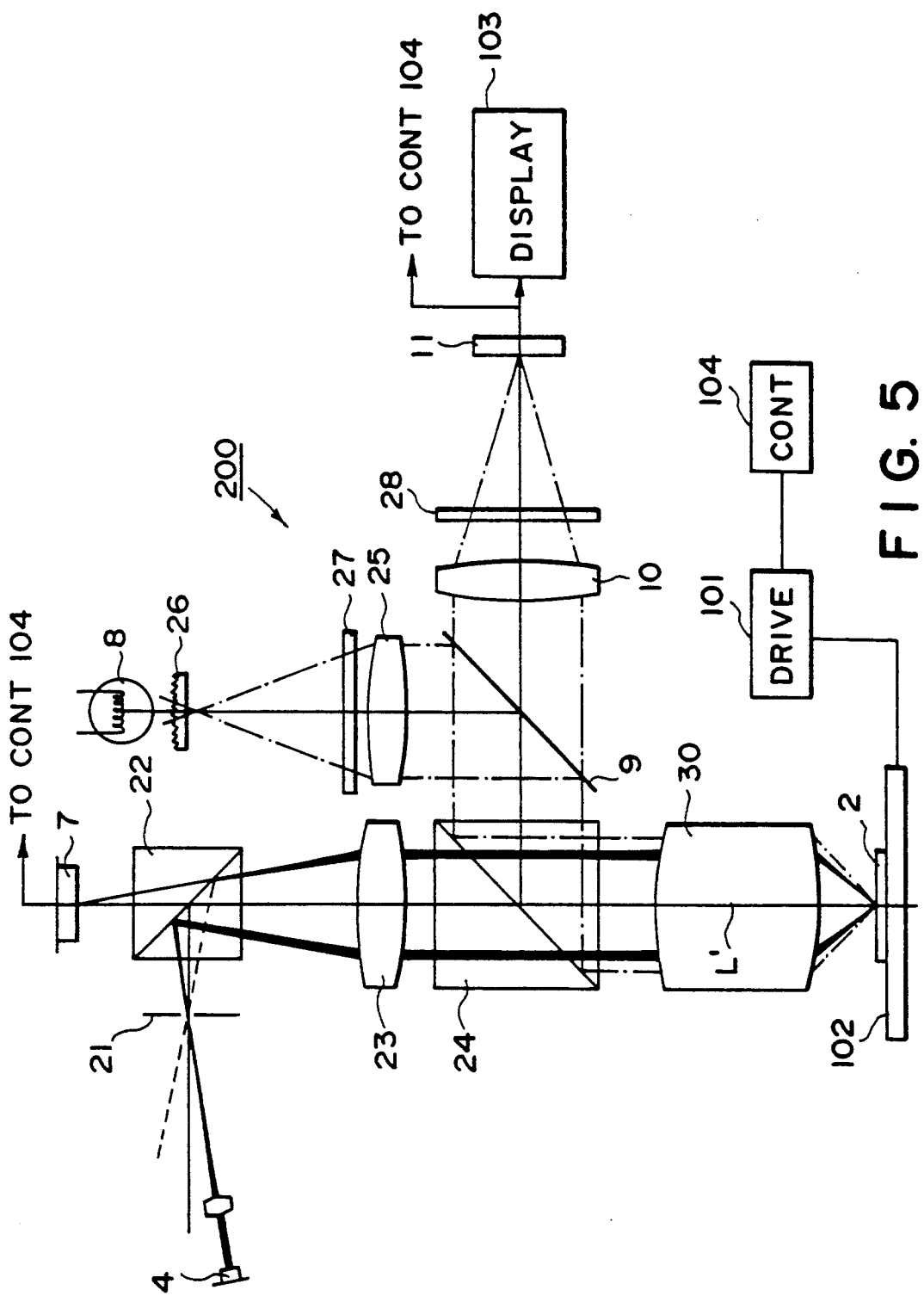
FIG. 5 is a schematic view of a projection exposure apparatus to which a fifth embodiment of the present invention is applied.

In the fifth embodiment shown in FIG. 5, the present invention is applied to a KrF excimer laser stepper. Off-axis alignment scope 200 is illustrated in FIG. 5. The alignment scope 200 is disposed beside a reduction projection lens system such as the projection lens system 3 shown in FIG. 1, having been designed with respect to a laser light (248.4 nm) from a KrF excimer laser. The alignment scope 200 is used to pick up an image of an alignment mark provided on the wafer 2 in relation to a particular zone (shot area) and to detect the position of the mark. By this, positional information for aligning the wafer 2 with a reticle (not shown) is obtainable. Usually, such information is used in a global alignment method. In this embodiment, the focusing method of the present invention is used for obtaining an image of an alignment mark of a wafer, by which the precision of detection of the position of the mark image is enhanced.

In FIG. 5, light from a first light source 8 illuminates a diffusion plate 26. Diffused light from the diffusion plate 26 passes through an infrared ray blocking filter 27, whereby infrared components are intercepted. After this, the light is collected by a condensing lens 25 and is incident on a half mirror 9. The light impinging on the half mirror 9 is reflected thereby toward a dichroic mirror (prism) 24. The mirror 24 reflects the received light toward an objective lens 30 by which the light is convergently incident on the wafer 2 to illuminate the scribe line area on the wafer 2 surface. An alignment mark is formed in this scribe line.

The light reflected by the wafer 2 surface is incident again on the objective lens 30 and then is reflected by the mirror 24. The reflected light passes through the mirror 9 to the observation lens 10. The lens 10 projects the received reflection light through an infrared ray blocking filter 28, whereby the light is convergently incident on the image pickup device 11. By this, an image of an alignment mark provided in relation to a particular zone of the wafer 2 is projected on the image pickup device 11.

Described above is the function of the first detecting means of this embodiment. Controller 104 serves to evaluate the contrast of the image of the alignment mark as projected on the image pickup device 11 on the basis of the output (video signal) from the image pickup device 11, while moving the stage 102 upwardly or downwardly through the driving means 101. The motion of the stage 102 is stopped at a position with which highest contrast is provided. By this, an image of the alignment mark is focused on the image pickup device 11. In other words, the alignment mark is positioned on the focal plane of the objective lens 30.

The second detecting means of this embodiment includes elements denoted at 4, 21, 22, 23, 24, 30 and 7. The position of the wafer 2 as determined by the first detecting means provides the position of the wafer 2 when the reference position for the incidence of the reflection light upon the light receiving means 7, for the surface position detection through the second detecting means, is to be determined. More specifically, the light from the second light source 4 is restricted by a lens and is passed through a projection slit 21. Then, the light is reflected by a half mirror 22 toward a relay lens 23, a dichroic mirror 24 and an objective lens 30. By the objective lens 30, the light is obliquely incident on a scribe line area of the wafer 2, in a direction inclined by 10–30 deg. with respect to the optical axis L'. Reflection light from the wafer 2 is collected by the objective lens 30, and the collected light is directed to the mirror 24 and is incident on the relay lens 23. By the relay lens 23, the reflection light is projected through the half mirror 22 upon the light receiving means 7. In this manner, the reference position on the light receiving means 7, that is, the position of incidence upon the light receiving means 7 of the light of the second detecting means as the wafer 2 surface is at the focus position of the objective lens 30, is determined. The determined reference position is memorized into a memory of the controller 104, as in the preceding embodiments.

The infrared blocking filters 27 and 28 are used to prevent mixture of lights to be detected by the image pickup device 11 and the light receiving means 7, respectively.

In this embodiment, for the global alignment process, alignment marks formed in relation to plural zones (shot areas) of the wafer 2 are detected by the image pickup device 11 in sequence. The focusing of each zone with respect to the focal plane of the objective lens 30, namely, the position of the wafer 2 in the optical axis L' direction is determined by detecting the reflection light from each zone through the light receiving means 7. The alignment scope 100 of this embodiment comprises an enlarging system and, since in such an enlarging system the power of the system is determined mainly by the objective lens 3, it is practically sufficient that only the action of the lens 3 which is a part of the alignment scope 200 is monitored.

In the present embodiment, the mirror 24 may be replaced by an ordinary deflection mirror and the elements 4, 21, 23, 24, 22 and 7 may be disposed between the observation lens 10 and the image pickup device 11.

The first light source and the second light source may be provided by one and the same light source to be used in common for the first and second detecting means, and light of the same center wavelength may be used for the detection. Also, different wavelengths of light from one and the same light source may be used.

Also in the fifth embodiment, like the preceding embodiments, the first detecting means for detecting an image of a mark can be used for the calibration of a reference for the position detection with the second detecting means, for detecting the position of a reflection beam. By using the second detecting means, detection and correction of a deviation of each zone of the wafer with respect to the focal plane of the objective lens 30 is executed, and a sharp image of an alignment mark of each zone is detected through the first detecting means. Thus, the alignment precision as well as the alignment speed can be improved significantly.

In the fifth embodiment, when an alignment mark of a wafer is positioned on the focal plane of the objective lens 30, the objective lens 30 may be moved upwardly or downwardly in place of moving the wafer stage. On that occasion, like the structure of the fifth embodiment, preferably the focal plane of the objective lens 30 is set at its focal point position and the light receiving surface of the image pickup device 11 is set at the focal point position of the lens 10 while the reflection light from the wafer 2 as illuminated by the second light source 8 goes along a parallel path between the objective lens 30 and the lens 10. In the FIG. 5 embodiment, the light from the first light source 4 goes along a path substantially parallel to the optical axis L', between the lens 23 and the objective lens 30.

In the embodiments described hereinbefore, each time a wafer of different structure in substrate or resist is used, the reference position of the sensor of the second detecting means is memorized into a memory of a controller for calibration of the reference position of the sensor. However, an optical element such as a mirror or a parallel plate may be provided in a portion of the optical system of the second detecting means so that, by the cooperation of such an optical member with the first detecting means, the calibration of the optical system of the second detecting means may be effected so as to avoid shift of the reference position of the second detecting means if a wafer of different substrate or resist structure is used.

While in the foregoing description the invention is applied to a stepper, the present invention is also applicable to other types of exposure apparatuses.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:
   a movable stage for holding a wafer;
   a projection optical system having a focal plane, for projecting an image of a circuit pattern of a reticle upon the focal plane;
   a first detection optical system having a first sensor, for detecting an image of a mark in a first region of the wafer through said projection optical system and said first sensor, wherein said first sensor is responsive to an intensity distribution of the image of the mark of the wafer;
   a second detection optical system having a second sensor, for projecting through said projection optical system a radiation beam onto the wafer in an inclined direction, and for detecting a reflection beam from the wafer through said projection optical system and said second sensor, wherein said second sensor is responsive to a position of incidence of the received reflection beam; and
   a controller for receiving outputs of said first and second sensors to control the movement of said movable stage, said controller being operable to evaluate the image of the mark in the first region of the wafer on the basis of the output of said first sensor while moving said stage in a direction of an optical axis of said projection optical system to determine the focal plane of said projection optical system and being operable to memorize the output of said second sensor as the first region of the wafer is substantially at the determined focal plane of said projection optical system, and said controller further being operable to cause said second detection optical system to project a radiation beam to a second region of the wafer and operable to evaluate an output of said second sensor produced in response to reception of a reflection beam from the second region of the wafer with respect to the memorized output of said second sensor, to control said movable stage to position the second region of the wafer on the determined focal plane of the projection optical system.

2. An apparatus according to claim 1, wherein said first detection optical system detects, through said first sensor, an image of an alignment mark formed in the first region of the wafer, positioned at the focal plane, and wherein said controller evaluates an output of said first sensor corresponding to the image of the alignment mark, to control motion of said movable stage for alignment of the second region on the basis of the evaluation.

3. An apparatus according to claim 2, wherein the second region includes a pattern region on which an image of the circuit pattern is projected and a scribe line on which the alignment mark is formed.

4. An apparatus according to claim 3, wherein the radiation beam has a wavelength substantially the same as that of a light beam used for the projection of the image of the circuit pattern.

5. An apparatus according to claim 3, wherein the radiation beam has a wavelength different from that of a light beam used for the projection of the image of the circuit pattern.

6. An apparatus according to claim 3, wherein said second detection optical system comprises a pair of mirrors disposed adjacent a pupil of said projection optical system, for allowing passage of each of the radiation beam and the reflection beam through a portion of said projection optical system, wherein one of said mirrors reflects the radiation beam to said portion of said projection optical system, while the other mirror reflects the reflection beam emanating from said portion to said second sensor.

7. An apparatus according to claim 3, wherein said second detection optical system comprises a pair of mirrors disposed above said projection optical system, and wherein one of said mirrors reflects the radiation beam toward said projection optical system, while the other mirror reflects the reflection beam emanating from said projection optical system to said second sensor.

8. An apparatus according to claim 7, wherein said mirrors are disposed above the reticle and wherein one of said mirrors reflects the radiation beam to said projection optical system to the reticle, while the other mirror reflects the reflection beam emanating from said projection optical system to said second sensor.

9. An apparatus according to claim 1, wherein the mark comprises an alignment mark.

10. An apparatus according to claim 9, wherein the mark is formed on a scribe line and wherein the radiation beam is projected to the scribe line.

11. A projection exposure apparatus, comprising:
a movable stage for holding a wafer;
a projection optical system having a focal plane, for projecting an image of a circuit pattern of a reticle upon the focal plane;
a detection optical system comprising (i) an objective lens disposed beside said projection optical system, (ii) first detecting means including a first sensor, for detecting an image of a mark in a first region of the wafer through said objective lens and said first sensor, and (iii) second detecting means including a second sensor, for projecting a radiation beam onto the wafer in an inclined direction through said objective lens and for detecting a reflection beam from the wafer through said objective lens and said second sensor, wherein said first sensor is responsive to an intensity distribution of the image of the mark of the wafer and wherein said second sensor is responsive to a position of incidence of the received reflection beam; and
a controller for receiving outputs of said first and second sensors to control the movement of said movable stage, said controller being operable to evaluate the image of the mark in the first region of the wafer on the basis of the output of said first sensor while moving said stage in a direction of an optical axis of said projection optical system to determine the focal plane of said projection optical system and being operable to memorize the output of said second sensor as the first region of the wafer is substantially at the determined focal plane of said projection optical system, and said controller further being operable to cause said second detection optical system to project a radiation beam to a second region of the wafer and operable to evaluate an output of said second sensor produced in response to reception of a reflection beam from the second region of the wafer with respect to the memorized output of said second sensor, to control said movable stage to position the second region of the wafer on the determined focal plane of the projection optical system.

12. An apparatus according to claim 11, wherein said first detection optical system detects, through said first sensor, an image of an alignment mark formed in the first region of the wafer, positioned at the focal plane, and wherein said controller evaluates an output of said first sensor corresponding to the image of the alignment mark, to control motion of said movable stage for alignment of the second region on the basis of the evaluation.

13. An apparatus according to claim 12, wherein the second region includes a pattern region on which an image of the circuit pattern is projected and a scribe line on which the alignment mark is formed.

14. An apparatus according to claim 12, wherein the radiation beam has a wavelength substantially the same as that of a light beam used for the projection of the image of the circuit pattern.

15. An apparatus according to claim 12, wherein the radiation beam has a wavelength different from that of a light beam used for the projection of the image of the circuit pattern.

16. An apparatus according to claim 15, wherein said detection optical system comprises (i) a first light source for supplying first light having a first wavelength, (ii) a second light source for supplying, as the radiation beam, thin second light having a second wavelength different from the first wavelength, (iii) a dichroic mirror disposed between said objective lens and said first and second light sources, for reflecting one of the first and second lights and transmitting the other, (iv) a combination of a first half mirror and a first condensing lens, disposed between said first light source and said dichroic mirror, for directing the first light from said first light source to said dichroic mirror and for receiving, through said dichroic mirror, reflection light produced by reflection of the first light by the wafer, to direct the received reflection light to said first sensor to thereby produce the image of the mark, (v) a second half mirror disposed between said second light source and said dichroic mirror, for directing the second light from said second light source to said dichroic mirror and for receiving, through said dichroic mirror, reflection light produced by reflection of the second light by the wafer, and (vi) a second condensing lens for collecting the reflection light from said second half mirror on said second sensor.

17. An apparatus according to claim 16, wherein said second light source comprises an infrared ray emitting element, a stop member having a predetermined opening and a lens for convergently directing infrared rays to said opening to produce the second light, and wherein the second light passes through said objective lens at a portion thereof spaced away from the optical axis thereof and is obliquely incident on the wafer.

18. An apparatus according to claim 17, wherein said first light source includes a lamp, a plate for diffusing light from said lamp, a filter for blocking an infrared component of the diffused light to extract the first light, and a first lens for collecting the first light from said filter and directing the same to said first mirror.

19. A method of manufacturing semiconductor devices, comprising the steps of:

projecting through an optical system a radiation beam to a first region of a wafer and projecting through the optical system a reflection beam from the first region of the wafer onto a predetermined plane;

determining, as a reference position, a position of incidence on the predetermined plane of the reflection beam from the first region of the wafer at a level corresponding to a focal plane of the optical system;

projecting a radiation beam, through the optical system, onto a second region of the wafer in an inclined direction, and projecting, onto the predetermined plane, a reflection beam from the second region of the wafer corresponding to a level of the second region of the wafer;

moving the second region of the wafer toward the focal plane on the basis of a position of incidence on the predetermined plane of the reflection beam from the second region of the wafer and the determined reference position;

detecting through the optical system an alignment mark of the second region of the wafer when it is at a level corresponding to the focal plane of the optical system;

adjusting the position of the second region of the wafer with respect to a circuit pattern to be transferred to the second region, on the basis of the detected image of the alignment mark; and printing the circuit pattern on the second region of the wafer.

20. A method according to claim 19, further comprising effecting the printing of the circuit pattern by projecting through a projection lens system an image of a circuit pattern, formed on a reticle, upon each region of the wafer.

21. A method according to claim 20, further comprising using the projection lens system as the optical system.

22. A method according to claim 19, wherein said printing step comprising printing the circuit pattern on the second region of the wafer through a projection optical system, which is separate from the optical system.

23. A method of manufacturing semiconductor devices, comprising the steps of:

forming an image of a pattern in a first region of a wafer through an optical system having a focal plane;

projecting through the optical system a radiation beam to the first region of the wafer and projecting through the optical system a reflection beam from the first region of the wafer onto a predetermined plane;

evaluating the formed image to determine the focal plane of the optical system and determining, as a reference position, a position of incidence on the predetermined plane of the reflection beam from the first region of the wafer at a level corresponding to the determined focal plane;

projecting a radiation beam, through the optical system, onto a second region of the wafer in an inclined direction, and projecting through the optical system a reflection beam from the second region of the wafer onto the predetermined plane;

positioning the second region of the wafer on the determined focal plane of the optical system on the basis of a position of incidence of the reflection beam from the second region of the wafer with respect to the determined reference position; and printing a circuit pattern on the positioned second region by using the optical system.

24. A method according to claim 23, further comprising effecting the printing of the circuit pattern by projecting through a projection lens system an image of a circuit pattern, formed on a reticle, upon each region of the wafer.

25. A projection exposure apparatus, comprising:

a movable stage for holding a wafer;

a projection optical system for projecting an image of a circuit pattern of a reticle upon the wafer;

a detection optical system disposed beside said projection optical system and comprising (i) first detecting means including an objective lens and a first sensor, for detecting an image of a first alignment mark in a first region of the wafer through said objective lens and said first sensor and (ii) second detecting means including a second sensor, for projecting a radiation beam, through said detection optical system, onto the wafer in an inclined direction and for detecting a reflection beam from the wafer through said second sensor, wherein said second sensor is responsive to a position of incidence of the received reflection beam; and a controller for receiving outputs of said first and second sensors to control the movement of said movable stage, said controller being operable to cause said second detecting means to project a radiation beam to a second region of the wafer and being operable to evaluate an output of said second sensor produced in response to reception of a reflection beam from the second region of the wafer to control said movable stage to move the second region toward a focal plane of said objective lens, said controller being further operable to cause said first detecting means to detect an image of a second alignment mark of the second region of the wafer as that region is at a level corresponding to the focal plane of said objective lens and being operable to evaluate an output of said first sensor corresponding to the detected image of the second alignment mark to control movement of said movable stage for alignment of the second region with respect to the reticle.

26. A method of positioning a particular zone of a substrate upon a focal plane of an optical system, said method comprising the steps of:

projecting light from a first light source to a mark of the substrate;

detecting, through the optical system and by using an image pickup device, an image of the mark irradiated with the light from the first light source, to produce a corresponding video signal by the image pickup device;

adjusting a relative position of the optical system and the substrate in the direction of an optical axis of the optical system, on the basis of the video signal to place the substrate at a reference position with respect to the focal plane;

projecting, through at least a portion of the optical system, reference light from a second light source in an inclined direction onto the substrate, which is placed at the focal plane, the reference light from the second light source being projected onto the substrate in a direction that is inclined with respect to the optical axis of the optical system;

detecting, through at least a portion of the optical system and through the detector, a reference light spot which is formed by light reflected by the substrate as a result of being irradiated with the reference light, and producing, by the detector, a reference signal corresponding to the position of the reference light spot upon a detection surface of the detector;

projecting, through at least a portion of the optical system, detection light from the second light source onto the particular zone along the optical axis direction;

detecting, through at least a portion of the optical system and through the detector, a detection light spot which is formed by light reflected by the particular zone as a result of being irradiated with the detection light, and producing, by the detector, a detection signal corresponding to the position of the detection light spot upon the detector surface of the detector; and adjusting the relative position of the particular zone and the focal plane in the direction of the optical axis of the optical system on the basis of the reference signal and the detection signal.

27. A method according to claim 26, wherein the substrate has a plurality of zones with respect to each of which a detection signal is detected, and further comprising adjusting the relative position of each zone and the focal plane on the basis of the reference signal and a corresponding detection signal.

28. A method according to claim 26, wherein the substrate has a plurality of zones and the mark is provided between adjacent zones.

29. A method according to claim 26, further comprising transferring a pattern onto each zone through the optical system.

30. A method according to claim 26, further comprising producing, after adjustment of the relative position of the zone and the focal plane in the direction of the optical axis of the optical system, data for positioning the zone in a direction intersecting the optical axis of the optical system on the basis of a video signal from the image pickup device.

31. A method of producing a semiconductor device by transferring a pattern onto a particular zone of a substrate, said method comprising the steps of:

projecting light from a first light source to a mark of the substrate;

detecting, through an optical system and by using an image pickup device, an image of the mark irradiated with the light from the first light source, to produce a corresponding video signal by the image pickup device;

adjusting a relative position of the optical system and the substrate in the direction of an optical axis of the optical system, on the basis of the video signal to place the substrate at a reference position with respect to a focal plane of the optical system;

projecting, through at least a portion of the optical system, reference light from a second light source in an inclined direction onto the substrate, which is placed at the focal plane, the reference light from the second light source being projected onto the substrate in a direction that is inclined with respect to the optical axis of the optical system;

detecting, through at least a portion of the optical system and through a detector, a reference light spot which is formed by light reflected by the substrate as a result of being irradiated with the reference light, and producing, by the detector, a reference signal corresponding to the position of the reference light spot upon a detection surface of the detector;

projecting, through at least a portion of the optical system, detection light from the second light source onto the particular zone along the optical axis direction;

detecting, through at least a portion of the optical system and through the detector, a detection light spot which is formed by light reflected by the particular zone as a result of being irradiated with the detection light, and producing, by the detector, a detection signal corresponding to the position of the detection light spot upon the detection surface of the detector;

adjusting the relative position of the particular zone and the focal plane in the direction of the optical axis of the optical system on the basis of the reference signal and the detection signal; and transferring the pattern onto the zone.

32. A method according to claim 31, wherein the substrate has a plurality of zones with respect to each of which a detection signal is detected, and further comprising adjusting the relative position of each zone and the focal plane on the basis of the reference signal and a corresponding detection signal.

33. A method according to claim 31, wherein the substrate has a plurality of zones and the mark is provided between adjacent zones.

34. A method according to claim 33, further comprising transferring the pattern onto each zone through the optical system.

35. A method according to claim 31, further comprising producing, after adjustment of the relative position of the zone and the focal plane in the direction of the optical axis of the optical system, data for positioning the zone in a direction intersecting the optical axis of the optical system on the basis of a video signal from the image pickup device.

36. A method according to claim 31, further comprising transferring the pattern to the zone through the optical system.

37. A method according to claim 36, wherein the substrate has a plurality of zones with respect to each of which a detection signal is detected, and further comprising adjusting the relative position of each zone and the focal plane on the basis of the reference signal and a corresponding detection signal, and transferring the pattern to each of the zones.

38. A method according to claim 37, wherein the mark is provided between adjacent zones.

39. A method according to claim 31, wherein said transferring step comprises transferring the pattern onto the zone through a projection optical system, which is separate from the optical system.

40. A method according to claim 39, further comprising producing, after adjustment of the relative position of the zone and the focal plane in the direction of the optical axis of the optical system, data for positioning the zone in a direction intersecting the optical axis of the optical system on the basis of a video signal from the image pickup device.

41. A method according to claim 40, wherein the substrate has a plurality of zones onto each of which the pattern is transferred.

42. A method according to claim 41, wherein the mark is provided between adjacent zones.

* * * * *

UNITED STATES PATENT AND TRADEMARK OFFICE
CERTIFICATE OF CORRECTION

PATENT NO. : 5,268,744
DATED : December 7, 1993
INVENTOR(S) : TETSUYA MORI, ET AL.

It is certified that error appears in the above-indentified patent and that said Letters Patent is hereby corrected as shown below:

COLUMN 8:

Line 67, "case" should read --cases--.

COLUMN 13:

Line 55, "direction" should read --direction,--.

COLUMN 14:

Line 40, "thin" should be deleted.

COLUMN 15:

Line 2, "includes" should read --comprises--; and
Line 49, "comprising" should read --comprises--.

Signed and Sealed this

Second Day of August, 1994

Attest:

BRUCE LEHMAN

Attesting Officer

Commissioner of Patents and Trademarks